June 21, 1966 J. E. VARGA 3,257,305

METHOD OF MANUFACTURING A CAPACITOR BY REACTIVE SPUTTERING OF TANTALUM OXIDE ONTO A SILICON SUBSTRATE

Filed Aug. 14, 1961

JOSEPH E. VARGA, INVENTOR.

BY John D'Italiani

United States Patent Office 3,257,305

Patented June 21, 1966

3,257,305

METHOD OF MANUFACTURING A CAPACITOR BY REACTIVE SPUTTERING OF TANTALUM OXIDE ONTO A SILICON SUBSTRATE

Joseph E. Varga, Dallas, Tex., assignor to Texas Instruments Incorporated, Dallas, Tex., a corporation of Delaware Filed Aug. 14, 1961, Ser. No. 131,149
4 Claims. (Cl. 204—192)

This invention relates to a method for forming oxide-type dielectric materials and more particularly to a reactive sputtering technique for forming thin tantalum oxide films.

In the production of semiconductor networks, for example, it is necessary to form capacitors, or dielectrics for use in capacitors, on the surface of a body of semiconductor material. Semiconductor networks are extremely small self-contained semiconductor devices containing several active elements such as transistors or diodes along with a number of integrally connected passive elements such as resistors, capacitors, etc. All of the elements or circuit components are formed in or on one or more wafers or substrates of semiconductor material. Various procedures have been previously used to form dielectrics on semiconductor substrates to provide capacitors in semiconductor networks. One of the prior techniques is vacuum deposition of oxide films such as silicon monoxide. Silicon monoxide, however, has a fairly low dielectric constant, on the order of 4–8, thus requiring capacitors having fairly large dimensions to produce capacitance values of substantial magnitude. Another technique which has previously been used to form dielectrics is the anodization of tantalum metal films, yielding fairly high capacitance values, the dielectric constant being 27 to produce capacitors having 0.75–2.5 microfarads per square inch of electrode area at 100–20 v. breakdown voltages respectively. The anodization process, however, is quite complicated and is not adaptable for semiconductor networks; that is, the anodization technique is not compatible with the various processes normally used for treating semiconductor wafers.

It is the principal object of this invention to provide a method of forming a dielectric film on semiconductor substrates in a manner compatible with the fabrication of semiconductor networks. Another object is to provide a method for reactive sputtering of tantalum oxide films for use in the production of capacitors. A further object is to provide a technique for depositing tantalum oxide on a support member, of semiconductor or other suitable material.

In accordance with this invention, a method of forming tantalum-oxide dielectrics is provided which may be generally described as reactive sputtering. In this method, a substrate of suitable material such as a semiconductor wafer is placed in a glow discharge in oxygen, the discharge being between a quantity of tantalum forming one electrode and the substrate forming the other electrode. Particles of tantalum, being of atomic size or larger, are driven off of the cathode by ionized oxygen atoms accelerated in the field between the electrodes. These particles of tantalum are attracted toward and deposited upon the anode. The tantalum may be oxidized upon collision at the cathode, during the travel from cathode to anode through the oxygen atmosphere, and also upon striking the anode. These three mechanisms by which the tantalum may be combined with oxygen ensure that a thorough oxidization is accomplished. In accordance with a further embodiment of the method of this invention, a tantalum-oxide layer which has been deposited by reactive sputtering is heat-treated or baked in an oxygen atmosphere to crystallize the thin film dielectric, providing improved characteristics.

The novel features believed characteristic of this invention are set forth in the appended claims. This invention itself, however, along with further objects and advantages thereof, may best be understood by reference to the following detailed description, when read in conjunction with the accompanying drawing, wherein:

Figure 1:
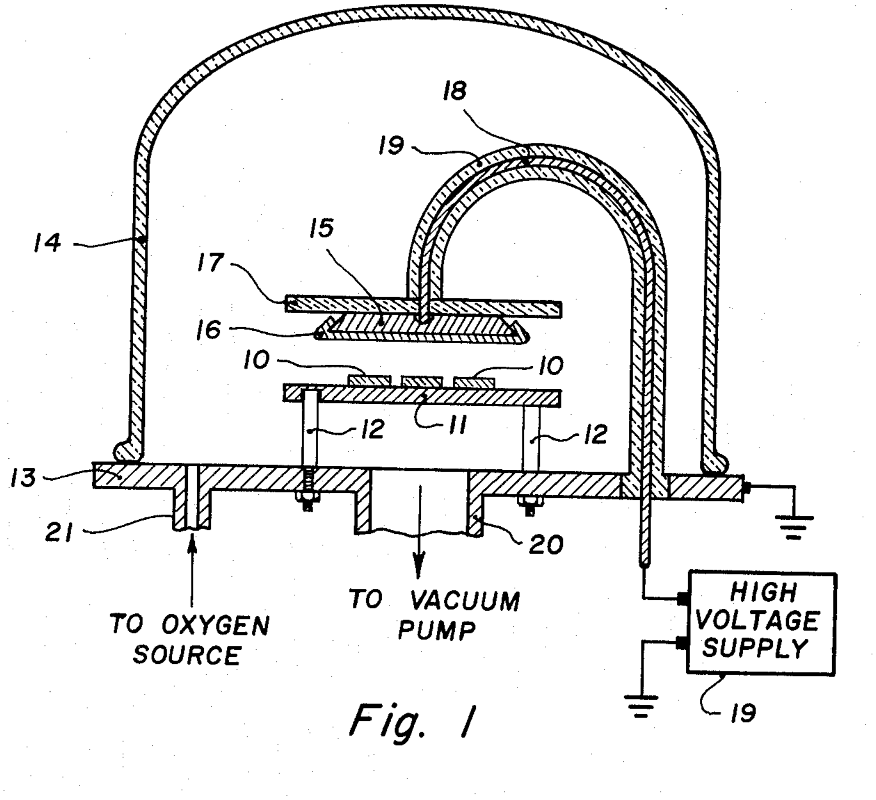
FIGURE 1 is a schematic representation partly in section of reactive sputtering apparatus adapted for performing the technique of this invention.

The process of this invention will be described with reference to the apparatus of FIGURE 1, although various arrangements would be suitable for practicing this method. A plurality of substrates 10 such as silicon slices are disposed upon a worktable 11 of aluminum or magnesium. The substrates 10 and the worktable 11 form the anode of the electrical discharge apparatus, the glow discharge taking the path of least resistance. The worktable 11 is supported by three aluminum or magnesium legs 12 which are mechanically and electrically connected to a conductive base plate 13. A bell jar 14 is placed over the base plate 13, a vacuum seal being provided between the bell jar and the base plate, resulting in the necessary sputtering chamber. The base plate 13 is grounded for safety purposes. Suspended above the anode or worktable 11 is a cathode assembly including an aluminum disc 15 upon which has been attached a thin tantalum plate 16. A disc 17 of glass or other nonconductive material is placed above the anode for shielding purposes. The cathode assembly is supported in the sputtering chamber by a suitable structure (not shown) having insulating properties. The cathode is connected to a high voltage source external of the sputtering chamber by means of a conductive lead 18 which is brought out through the base plate 13. An insulator 19 composed of a material such as glass surrounds the conductor 18 to avoid arcing between the conductor and the anode. The conductor 18 is connected to a suitable high voltage supply 19 which may be variable up to about −3 kv. and 300 milliamp. The interior of the sputtering chamber is connected by a passage 20 in the base plate 13 to a vacuum pump and a diffusion pump (not shown) which are effective to evacuate the interior of the chamber to a suitable pressure and to maintain a low pressure during sputtering. Another passage 21 in the base plate 13 is connected to a source of oxygen (not shown) which may comprise an oxygen pressure tank and a calibrated leak valve for admitting a suitable amount of oxygen into the sputtering chamber while the diffusion pump is at the same time maintaining the pressure within the chamber at the desired value.

Although not limited to such a configuration, the substrates 10 may take the form of N-type silicon slices of about one inch in diameter and ten mils in thickness, the resistivity being about 6 to 8 ohm centimeters. The upper surface of the substrates must be smooth and free of contamination, so this surface is polished and the slices are cleaned ultrasonically in tricholoroethylene and in HF. The slices are rinsed in distilled deionized water and dried in a methylalcohol vapor prior to placing them in the sputtering chamber.

The suitably prepared silicon substrates 10 are placed on the worktable 11 and the cathode assembly including the thin tantalum plate 16 is positioned a few centimeters therefrom. The sputtering chamber is first evacuated through the passage 20 to a pressure of about $5\times10^{-6}$ torr by the vacuum pump and the diffusion pump. Oxygen is then admitted to the chamber through the passage 21 to an extent such that a pressure of about 25 to 100 micron is reached and this pressure is stabilized while the diffusion pump continues to run. This arrangement provides an oxygen flow of about 10 liters/sec. through the sputtering chamber. A voltage greater than about one kilovolt is applied between the cathode and anode by the supply 19, initiating the sputtering. The high voltage is maintained or the sputtering is continued for a time of from a few minutes to several hours, after which the substrates 10 are removed from the sputtering chamber.

Figure 2:
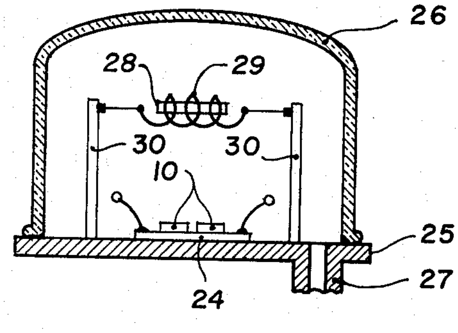
FIGURE 2 is a schematic representation partly in section of an evaporation chamber adapted for depositing conductive films on the dielectric film as the upper plate of capacitors fabricated according to this invention.

Capacitors fabricated according to this invention must necessarily include contacts plated or otherwise formed on top of the reactively sputtered dielectric. Apparatus suitable for evaporating aluminum films on the tantalum oxide dielectric is shown in FIGURE 2. The silicon substrates 10, with thin film dielectrics reactively sputtered thereon, are placed on a heater plate 24 which is positioned on a base plate 25. An evaporation chamber is formed by a bell jar 26 sealed to the base plate 25, the interior of the evaporation chamber being evacuated through a passage 27 in the base plate which is connected to a vacuum pump (not shown). A small bar 28 of aluminum is placed within a filament 29 which is suspended above the substrates 10 by suitable supporting members 30. In the operation of the evaporation chamber, the interior is evacuated to a pressure of about $7.5\times10^{-6}$ torr and current is passed through the heating plate 24 by means of leads connected to either end thereof and brought out through the base plate. At the same time current is passed through the heating coil 29 by means of leads connected to a suitable current source exterior of the evaporator chamber. Aluminum from the bar 28 is then evaporated onto the hot surfaces of the silicon substrates 10 covered with the sputtered oxide film which are maintained at a temperature of about 300° C. by means of the heating plate. The evaporation is continued for about 5 minutes or for a time sufficient to form an aluminum film approximately 5000 A. thick. Of course, suitable masking techniques may be used to limit the size and shape of the aluminum plates thus formed.

After the top plates are formed on the tantalum oxide dielectrics, the other electrodes of the capacitors are formed on the bottom of the silicon substrates by waxing the substrates face down onto glass slides and then electroless nickel plating the bottom contacts thereon by conventional techniques. The capacitors may be mounted on headers, or upon suitable ceramic or other base plates incorporating conductive strip leads, by means of an alloy such as gold-germanium. A contact may be made to the top plate or the aluminum film by a conventional technique, such as ball bonding a one mil gold wire thereto.

Figure 3:
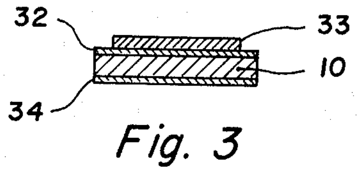
FIGURE 3 is a sectional view of a capacitor formed according to the techniques of this invention.

As seen in FIGURE 3, capacitors formed according to this invention include the substrates 10 with a thin layer 32 of $Ta_2O_5$ thereon. An aluminum contact 33 is formed on top of the oxide layer, and a layer 34 of nickel plating will appear on the lower surface of the substrate.

In a preferred embodiment of the process thus far described, the worktable 11 is positioned about 2.3 cm. from the tantalum plate 16, and the sputtering chamber is evacuated to a pressure of $5\times10^{-6}$ torr. Oxygen is admitted to bring the pressure up to 50 micron and sputtering is initiated by applying −1.6 kv. between the worktable 11 and the cathode assembly. If sputtering is continued for 10 minutes, a $Ta_2O_5$ layer of about 270 A. will be deposited, while a sputtering time of 4 hours will produce a layer of about 1200 A. thickness. Intermediate times will result in proportionate thicknesses, the optimum being about 300–400 A. for highest capacitance values at 15 v. breakdown voltage.

Figure 4:
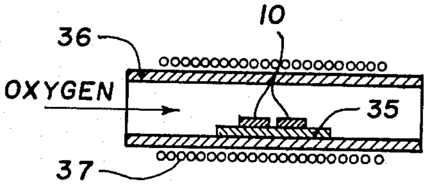
FIGURE 4 is a sectional view of a tube furnace adapted for further heat treatment of the sputtered oxide film in accordance with this invention.

An examination of the tantalum oxide films formed by the process described thus far will show that the films are essentially amorphous. A somewhat improved dielectric may be formed by reoxidizing the dielectric film formed in the techniques described above in such a manner as to promote crystal growth, particularly with respect to relatively thin films of around 300 A. That is, a significantly greater breakdown voltage and a much lower dissipation factor may be obtained by treating the tantalum oxide coated substrates prior to application of the contacts by baking in an atmosphere of oxygen for an hour or more. Apparatus suitable for this treatment is illustrated in FIGURE 4, wherein the substrates 10 are seen to be disposed on a quartz worktable 35 within a tube furnace. The furnace includes a hollow cylinder 36 surrounded by heating means such as a resistance coil 37. The substrates are heated to a temperature of about 800° C. and oxygen is forced through the tube at the rate of about 5 liters per minute. This baking or reoxidization is continued for about one to three hours to provide higher breakdown voltages and lower dissipation factors. After reoxidization and crystallization in the apparatus of FIGURE 4, the top contacts and back plates are applied by the techniques described above.

While the process of this invention has been described with reference to specific examples, this description is not meant to be construed in a limiting sense. Various modifications may be made by persons skilled in the art on the basis of this specification and so it is contemplated that the appended claims will cover any such modifications as fall within the true scope of the invention.

What is claimed is:

1. A method of manufacturing a capacitor comprising the steps of placing an electrically conductive silicon substrate in a glow discharge in oxygen between a tantalum body and said substrate to deposit a layer of tantalum oxide thereon, evaporating a conductive layer onto said tantalum oxide layer, and providing a conductive contact to said electrically conductive silicon substrate spaced from said tantalum oxide layer.

2. A method of manufacturing a capacitor comprising the steps of placing an electrically conductive silicon substrate in an oxygen glow discharge between a tantalum body and said substrate to deposit a layer of amorphous tantalum oxide on said substrate, removing said substrate from said glow discharge, heating said substrate in an oxygen-rich atmosphere, evaporating a conductive layer on the surface of said tantalum oxide layer, and providing a conductive contact to said electrically conductive silicon substrate spaced from said tantalum oxide layer.

3. A method of manufacturing a capacitor device comprising the steps of placing an electrically conductive silicon substrate in a chamber, positioning a body of tantalum adjacent said substrate in said chamber, evacuating said chamber while at the same time admitting oxygen thereto such that a substantial oxygen flow is maintained, the pressure in said chamber remaining below 100 microns, applying a potential of at least one kilovolt between said substrate and said body for a period of at least 10 minutes whereby a film of tantalum oxide will be deposited on said substrate, and thereafter heating said substrate and film at a temperature of about 800° C. for at least one hour to promote crystal growth.

4. In a method of manufacturing a capaictor, the steps of placing an electrically conductive silicon substrate in a low pressure oxygen atmosphere adjacent a body of tantalum, applying a potential between said substrate and said body to produce reactive sputtering, whereby a film of tantalum oxide is deposited over said substrate, and depositing a conductive layer onto said tantalum oxide.

(References on following page)

References Cited by the Examiner

UNITED STATES PATENTS

| | | | |
|---|---|---|---|
| 1,925,307 | 9/1933 | Deboer et al. | 317—258 |
| 2,754,259 | 7/1956 | Robinson et al. | 204—192 |
| 2,883,305 | 4/1959 | Auwarter | 204—192 |
| 2,886,502 | 5/1959 | Holland | 204—192 |
| 2,917,442 | 12/1959 | Hanlet | 204—192 |
| 2,964,830 | 12/1960 | Henkels et al. | 317—240 X |
| 2,993,266 | 7/1961 | Berry | 29—25.42 |
| 3,128,545 | 4/1964 | Cooper | 117—200 X |

FOREIGN PATENTS

| | | |
|---|---|---|
| 878,585 | 6/1953 | Germany. |
| 799,222 | 8/1958 | Great Britain. |
| 89,651 | 12/1958 | Netherlands. |

OTHER REFERENCES

Berry et al.: "Tantalum Printed Capacitors," Proceedings of the IRE, June 1959, pp. 1070–1075.

Cass: "On Tantalum Capacitors," Semiconductor Products, May/June 1958, pp. 39–40.

Jones: Inorganic Chemistry, 1947, pp. 314 and 668.

Z. Physik, vol. 38, pp. 575–588 (1926).

ALLEN B. CURTIS, *Primary Examiner.*

JOHN H. MACK, MURRAY TILLMAN, WINSTON A. DOUGLAS, *Examiners.*

P. SULLIVAN, G. BATTIST, B. J. OHLENDORF, *Assistant Examiners.*